(12) United States Patent
Kim (10) Patent No.: US 11,456,430 B2
(45) Date of Patent: Sep. 27, 2022

(54) FLEXIBLE DISPLAY APPARATUS HAVING A WELL AND A DISCONTINUOUS REGION IN AN ENCAPSULATION LAYER

(71) Applicant: LG Display Co., Ltd., Seoul (KR)

(72) Inventor: Miseong Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/678,877

(22) Filed: Nov. 8, 2019

(65) Prior Publication Data

US 2020/0168823 A1 May 28, 2020

(30) Foreign Application Priority Data

Nov. 22, 2018 (KR) .......................... 10-2018-0145003

(51) Int. Cl.
*H01L 51/00* (2006.01)
*H01L 51/52* (2006.01)
*H01L 27/32* (2006.01)

(52) U.S. Cl.
CPC ...... *H01L 51/0097* (2013.01); *H01L 27/3246* (2013.01); *H01L 51/5253* (2013.01)

(58) Field of Classification Search
CPC ............. H01L 27/3246; H01L 27/3258; H01L 51/525; H01L 51/5256; H01L 2251/5338
See application file for complete search history.

(56) References Cited

U.S. PATENT DOCUMENTS

| 2013/0248867 | A1* | 9/2013 | Kim | ................... H01L 27/3246 257/59 |
| 2014/0117341 | A1* | 5/2014 | Song | .................. H01L 51/0097 257/40 |
| 2016/0118451 | A1* | 4/2016 | Youn | ................... H01L 27/3262 257/40 |
| 2017/0331058 | A1* | 11/2017 | Seo | .......................... G09F 9/30 |
| 2020/0127235 | A1* | 4/2020 | Cao | ..................... H01L 27/3258 |

FOREIGN PATENT DOCUMENTS

KR 10-2013-0077015 A 7/2013

* cited by examiner

*Primary Examiner* — Jesse Y Miyoshi
(74) *Attorney, Agent, or Firm* — Seed IP Law Group LLP

(57) ABSTRACT

A flexible display device including a well structure. An organic light-emitting element including a pixel electrode, an organic light-emitting layer, and a common electrode is disposed on a substrate. A bank layer is disposed on the pixel electrode, and is disposed to open at least a part of the pixel electrode. Further, at least one well structure is disposed on the bank layer. The well structure disposed on the bank layer can reduce or minimize a delamination phenomenon of an encapsulation layer which can occur due to compressive and tensile stress caused by bending of the flexible display device.

10 Claims, 9 Drawing Sheets

Tensile stress

*FIG.3B*

Compressive stress

FLEXIBLE DISPLAY APPARATUS HAVING A WELL AND A DISCONTINUOUS REGION IN AN ENCAPSULATION LAYER

CROSS REFERENCE TO RELATED APPLICATION

This application claims priority to Korean Patent Application No. 10-2018-0145003, filed Nov. 22, 2018, which is hereby incorporated by reference for all purposes as if fully set forth herein.

BACKGROUND

Technical Field

The present disclosure generally relates to a flexible display device.

Description of the Related Art

Display devices can be divided into liquid crystal displays devices in which liquid crystals are used to produce an image, and organic light-emitting diode display devices in which an organic light-emitting layer is used to do so. Moreover, a demand for flexible or foldable display devices instead of flat panel display devices has recently been rising.

The organic light-emitting diode display devices in which an organic light-emitting element is used as a pixel for producing an image do not require a separate light source compared to the liquid crystal display devices. As a result, the organic light-emitting diode display devices can be made lighter and thinner, and can be fabricated as flexible display devices. These organic light-emitting diode display devices are not only advantageous in the aspect of power consumption due to low-voltage driving, but also are excellent in hue realization, response speed, viewing angle, and contrast ratio (CR). Thus, researches into application of flexible display devices have been actively conducted.

The organic light-emitting diode display devices include a substrate including driving elements formed of a thin film transistor, pixel electrodes connected to the driving elements, an organic light-emitting layer, and a common electrode, which are formed in order, and are configured such that the organic light-emitting layer is driven to emit light by driving signals of the driving elements.

The organic light-emitting layer emits light when electrons and holes injected from the pixel electrodes and the common electrode meet at the organic light-emitting layer and form excitation. The organic light-emitting layer is especially sensitive to moisture and oxygen. To prevent permeation of the moisture and the oxygen, the organic light-emitting layer includes one or more encapsulation layers above organic light-emitting elements.

A thin-film encapsulation technique for alternately laminating inorganic and organic materials to seal the organic light-emitting elements may be used for the encapsulation layer. A material such as aluminum oxide (AlOx) or silicon nitride (SiNx) able to secure an excellent barrier characteristic with a small thickness is mainly used for a thin-film encapsulation layer formed of an inorganic material.

In the flexible display devices, a structure, in which the inorganic and organic materials of the aforementioned encapsulation layer are alternately laminated (or deposited), is easily damaged by repetition of compressive stress and tensile stress. For this reason, there may be a problem related to reliability and lifetime of the flexible display devices in which an organic light-emitting element is used as a pixel.

BRIEF SUMMARY

In the flexible display devices in which an organic light-emitting element is used as a pixel, as described above, delamination or cracks may occur in the light emitting layer or the thin-film encapsulation layer when the display device is repetitively bent and unbent.

Thus, the inventors of the present disclosure have invented a new structure of the flexible display device that can reduce the stress such as the compressive stress and the tensile stress in an environment that the flexible display device is exposed to such stress.

One or more embodiments of the present disclosure provide a flexible display device which is less likely to have cracks in an encapsulation layer caused by the stress such as repetitive bending and unbending.

One or more embodiments of the present disclosure provide a flexible display device that is less likely have damage to an encapsulation layer caused by the stress such as repetitive bending and unbending and thereby increases reliability and lifetime of the flexible display.

The object of the present disclosure is not limited to the aforementioned description, and other objects not explicitly disclosed herein will be clearly understood by a person having ordinary skill in the art to which the present disclosure pertains from the description provided hereinafter.

According to at least one embodiment of the present disclosure, a flexible display device in which reliability of a service life on bending or the like is provided. A driving element is disposed on a flexible substrate along with a planarization layer and a bank layer. An organic light-emitting element is disposed on the planarization layer, and the bank layer that opens the organic light-emitting element is disposed. The organic light-emitting element is covered by an encapsulation layer including a first encapsulation layer, a second encapsulation layer, and a third encapsulation layer, and the bank layer includes at least one well structure, so that cracks or a delamination phenomenon that can occur in the encapsulation layer in a flexing environment can be reduced.

According to at least one embodiment of the present disclosure, the flexible display device includes at least one well structure on the bank layer. The well structure can be used to reduce damage caused by bending stress of the encapsulation layer.

Further, according to at least one embodiment of the present disclosure, at least one well structure and the second encapsulation layer trapped by the well structure have an effect of more effectively reducing damage caused by bending stress and can further improve reliability of a service life.

The effects of the present disclosure are not limited to the effects described above, and other undescribed effects will be clearly understood to those skilled in the art from the following description.

The contents of the disclosure which are described in the problem to be solved, the solution to the problem, and the effects do not specify essential features of the claims, and thus the scope of the claims is not limited by the matters described in the contents of the disclosure.

DESCRIPTION OF THE SEVERAL VIEWS OF THE DRAWINGS

The above and other objects, features, and advantages of the present disclosure will be more clearly understood from the following detailed description, taken in conjunction with the accompanying drawings, in which.

DETAILED DESCRIPTION

The advantages and features of the present disclosure and methods of the realization thereof will be apparent with reference to the accompanying drawings and detailed descriptions of the embodiments. The present disclosure should not be construed as being limited to the embodiments set forth herein and may be embodied in many different forms. Rather, these embodiments are provided so that the present disclosure will be thorough and complete, and will fully convey the scope of the present disclosure to a person having ordinary skill in the art.

The shapes, sizes, ratios, angles, numbers, and the like, inscribed in the drawings to illustrate exemplary embodiments are illustrative only, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted in the situation in which the subject matter of the present disclosure may be rendered unclear thereby. It will be understood that the terms "comprise," "include," "have," and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the situation in which there is no explicit description thereof.

When spatially relative terms, such as "on," "above," "under," "below," and "on a side of," are used herein for descriptions of relationships between one element or component and another element or component, one or more intervening elements or components may be present between the one and other elements or components, unless a term, such as "directly," is used.

In addition, terms, such as "first" and "second" may be used herein to describe a variety of components. It should be understood, however, that these components are not limited by these terms. These terms are merely used to discriminate one element or component from other elements or components. Thus, a first component referred to as first hereinafter may be a second component within the spirit of the present disclosure.

The features of one or more embodiments of the present disclosure may be partially or entirely coupled or combined with each other and may work in concert with each other or may operate in a variety of technical methods. In addition, respective one or more embodiments may be carried out independently or may be associated with and carried out in concert with other embodiments.

With regard to various configurations of an organic light-emitting diode display device able to reduce or minimize a delamination phenomenon of an organic light-emitting layer or an encapsulation layer according to one or embodiments of the present disclosure, various embodiments of the present disclosure will be described below in detail with reference to the attached drawings.

Figure 1A:
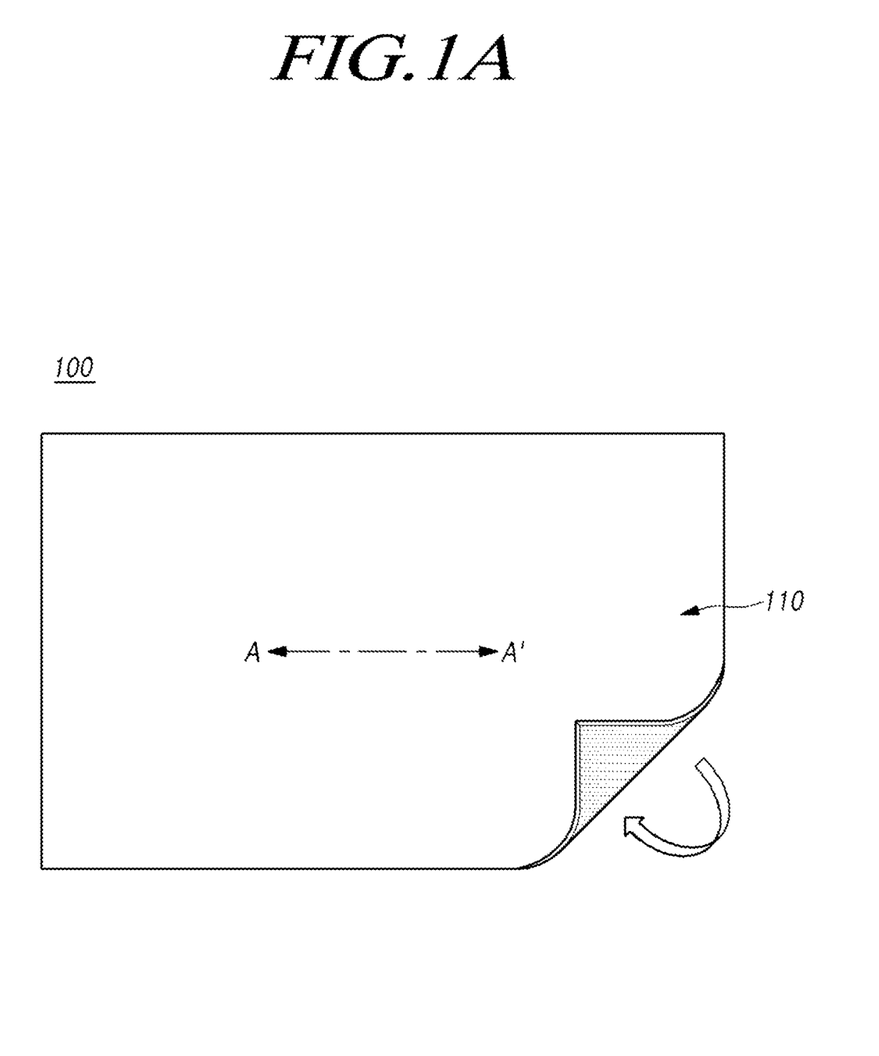
FIGS. 1A to 1C are schematic views illustrating a flexing environment according to an embodiment of the present disclosure.
Figure 1B:
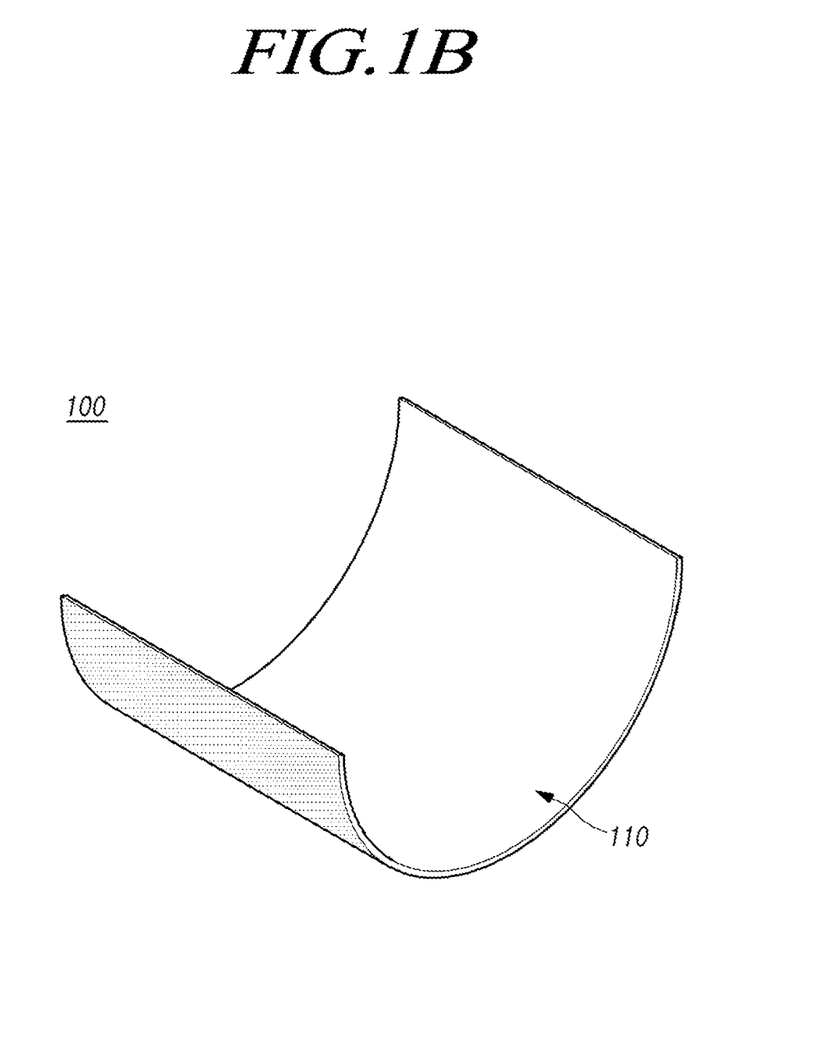
Figure 1C:
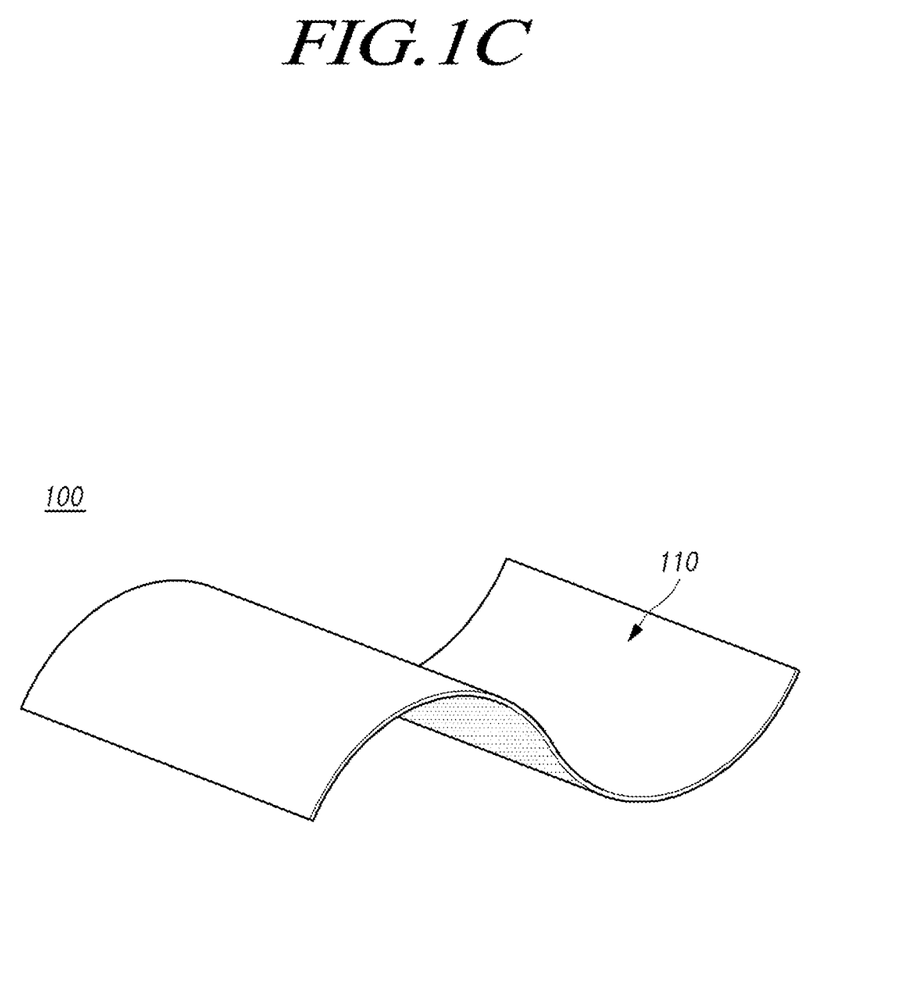

FIGS. 1A to 1C are schematic views illustrating a flexing environment according to one or more embodiments of the present disclosure. Referring to FIGS. 1A to 1C, a flexible display device 100 may include a substrate 110 as a base, and various components disposed on the substrate 110. The substrate 110 may include a plurality of pixel regions and driving elements formed of a thin film transistor located on each pixel region, and may be formed of a plastic material having a flexible characteristic.

The plastic material of the substrate 110 may include, but not limited to, polyethersulfone, polyacrylate, polyetherimide, polyethylene naphthalate, polyethylene terephthalate, polyphenylene sulfide, polyallylate, polyimide, polycarbonate, or the like, and may be various materials of which a flexible substrate is formed.

As illustrated in FIG. 1A, the flexible display device 100 using the aforementioned substrate 110 as the base can be rolled, bent, or folded. As illustrated in FIG. 1B, the flexible display device 100 may be utilized as a rollable or extremely curved display device. Further, as illustrated in FIG. 1C, the flexible display device 100 may be curved or bent in various directions rather than one direction.

A phenomenon in which the flexible display device that is curved, extremely bent or unbent in this way is, for example, delaminated easily because a bonding force between the components is reduced by bending stress. A concrete example of defects occurring in a flexing environment will be described.

Figure 2:
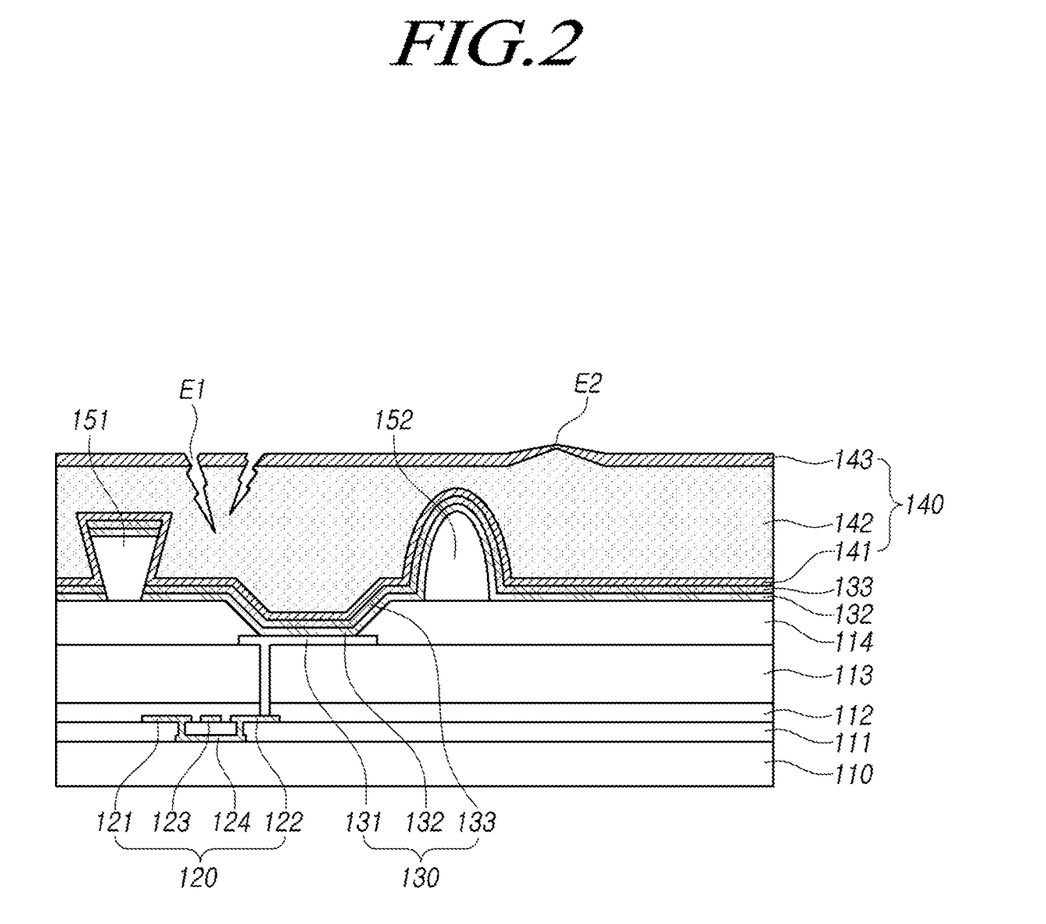
FIG. 2 is a schematic sectional view illustrating cracks and a delamination phenomenon that occur in a flexible display device, taken along line A-A' of FIG. 1A.

FIG. 2 is a schematic sectional view illustrating cracks and a delamination phenomenon that occur in the flexible display device, taken along line A-A' of FIG. 1A.

Two typical defects occurring in the flexible display device will be described with reference to FIG. 2.

The substrate 110 may be a flexible substrate 110, and the following elements for constituting the organic light-emitting diode display device may be disposed on the substrate 110.

A driving element 120 comprised of a source electrode 121, a drain electrode 122, an active electrode 124, and a gate electrode 123 is disposed on the substrate 110. The active electrode 124 is disposed to correspond to the gate electrode 123, and the source electrode 121 and the drain electrode 122 are electrically connected to the active electrode 124 through contact holes passing through an insulating layer 111, and the gate electrode 123 and the active electrode 124 are insulated by the insulating layer 111.

A passivation layer 112 and a planarization layer 113 are disposed on the source electrode 121 and the drain electrode 122, and a pixel electrode 131 is disposed on the planarization layer 113.

The planarization layer 113 may include a material having excellent heat resistance, such as an acrylic resin, an epoxy resin, a phenol resin, a polyamide resin, a polyimide resin, an unsaturated polyester resin, a polyphenylene resin, a polyphenylene sulfide resin, benzocyclobutene, or the like.

The passivation layer 112 may include a single layer or a plurality of layers, is formed of silicon oxide ($SiO_2$) or silicon nitride (SiNx) that is an inorganic insulating material in order to interrupt inflow of moisture or oxygen, or may include an organic material such as a polymer.

An organic light-emitting element 130 comprised of the pixel electrode 131, an organic light-emitting layer 132, and a common electrode 133 is disposed on the planarization layer 113. Further, a bank layer 114 that opens the pixel electrode 131 is disposed on the planarization layer 113.

The pixel electrode 131 is connected to the drain electrode 122 of the driving element 120, which is the thin film transistor, through a via-hole that passes through the planarization layer 113 and the passivation layer 112. In particular, the pixel electrode 131 may be formed of a material having high reflectivity in order to reflect light emitted from the organic light-emitting layer 132.

The aforementioned pixel electrode 131 may be formed of, for example, at least one of molybdenum (Mo), aluminum (Al), silver (Ag), chromium (Cr), gold (Au), titanium (Ti), nickel (Ni), neodymium (Nd), or copper (Cu), or an alloy including at least one of these materials.

The bank layer 114 may be formed of, for example, at least one of polyimide, photo acryl, or benzocyclobutene (BCB) that an organic insulating material having a general photosensitive characteristic, or may be formed of a black resin that is a material showing black.

The organic light-emitting layer 132 is provided on the pixel electrode 131. The organic light-emitting layer 132 may be an organic light-emitting layer that is configured to emit red, green, or blue light, or may be an organic light-emitting layer 132 that emits white light or UV light.

The organic light-emitting layer 132 may be disposed on a partial region that corresponds to the pixel electrode 131, or may be disposed on an entire region that corresponds to the pixel electrode 131 by various processes of disposing the organic light-emitting layer 132.

The common electrode 133 is disposed on the organic light-emitting layer 132, and an encapsulation layer 140 is disposed on the common electrode 133. The common electrode 133 may be formed of a transparent conductive material such as ITO, and the encapsulation layer 140 may have a structure in which an inorganic material and an organic material are alternately disposed.

As illustrated in FIG. 2, the encapsulation layer 140 may have a structure in which an inorganic material and an organic material are alternately disposed. The aforementioned encapsulation layer 140 may include a first encapsulation layer 141, a second encapsulation layer 142, and a third encapsulation layer 143.

For example, the first encapsulation layer 141 and the third encapsulation layer 143 may be encapsulation layers formed of an inorganic material, and the second encapsulation layer 142 may be an encapsulation layer formed of an organic material, such that the inorganic material and the organic material are alternately disposed in the encapsulation layer 140.

Meanwhile, an inverted tapered structure 151 and a spacer 152 may be disposed on the bank layer 114. The inverted tapered structure 151 disposed on the bank layer 114 may be an inverted tapered structure, at least one side of which has an inverted tapered shape in order to reduce or minimize delamination between the organic light-emitting layer 132 or the common electrode 133 and the first encapsulation layer 141.

The spacer 152 has a structure that supports a mask such as a fine metal mask (FMM) in a process of disposing the organic light-emitting layer 132, and serves to prevent the other components from generating foreign materials due to the mask.

Hereinafter, two typical kinds of defects that can occur in the flexible display device will be described with further reference to FIGS. 3A and 3B.

Figure 3A:
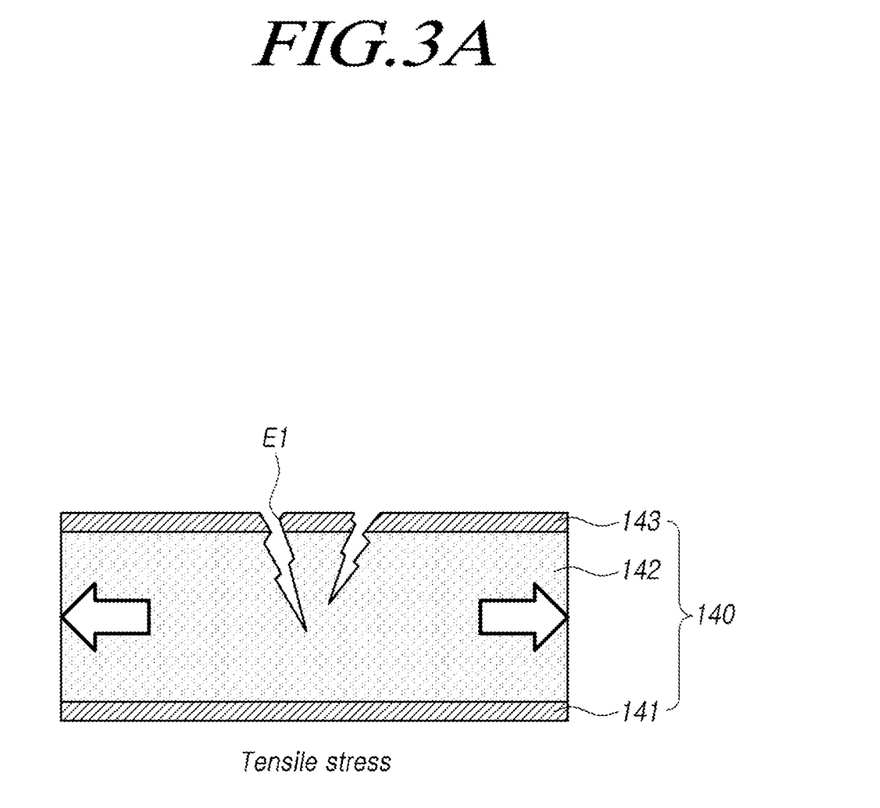
FIGS. 3A and 3B are schematic views illustrating cracks, a delamination phenomenon, and bending stress that occur in the flexible display device.
Figure 3B:
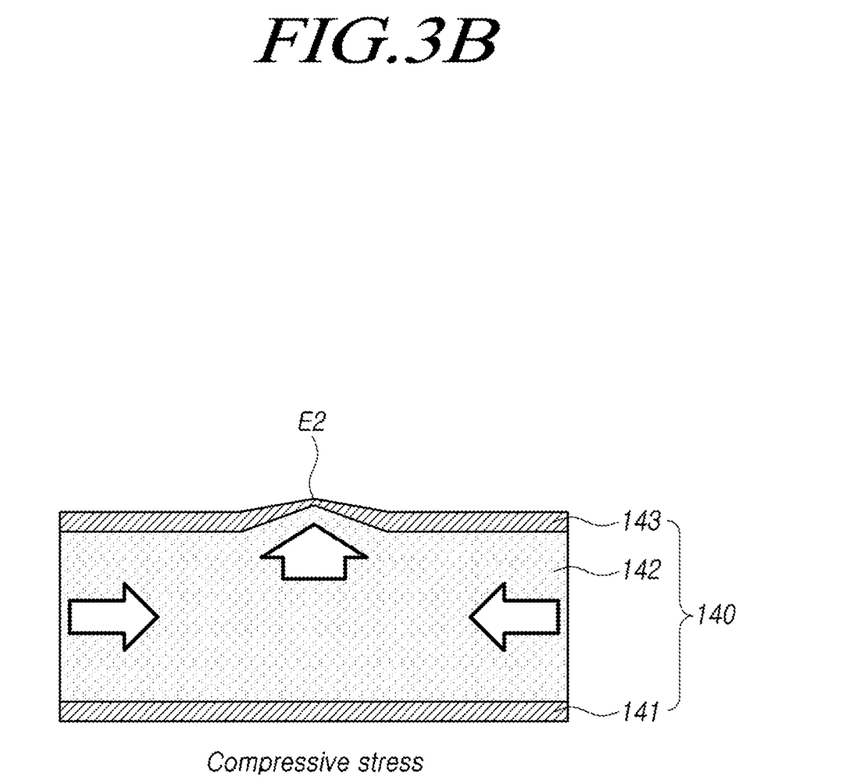

FIGS. 3A and 3B are schematic views illustrating cracks, a delamination phenomenon, and bending stress that occur in the flexible display device.

Causes and effects of first and second defects E1 and E2 illustrated in FIG. 2 will be described with reference to FIGS. 3A and 3B as follows.

The first defect E1 may be caused by the tensile stress which may damages the third encapsulation layer 143 as illustrated in FIG. 3A. The encapsulation 143 protects the flexible display device from moisture and oxygen. As a result of the first defect E1, a moisture (or oxygen) permeation path can be created as illustrated in FIG. 3A. In other words, in the case of the tensile stress, intermolecular bonding forces of the first to third encapsulation layers 141 to 143 are weakened due to repeated tensile stress, and cracks occur, so that the moisture (or any fluids, gases, etc., such as oxygen) permeation path occurs.

In the case of the second defect E2, interlayer bonding forces between the first to third encapsulation layers 141 to 143 are weakened by compressive stress. This results in a phenomenon in which a concentrated pressure does not find an exit and is concentrated on a portion at which the interlayer bonding force is weak, and delamination occurs.

In this way, the first defect E1 and the second defect E2 can occur in a combined form. This is because the cracks and the delamination can occur together due to the repeated stress by which the intermolecular and interlayer bonding forces are weakened, compression and tension are added to a portion at which the defect occurs once, and a degree of the defect becomes worse.

Figure 4:
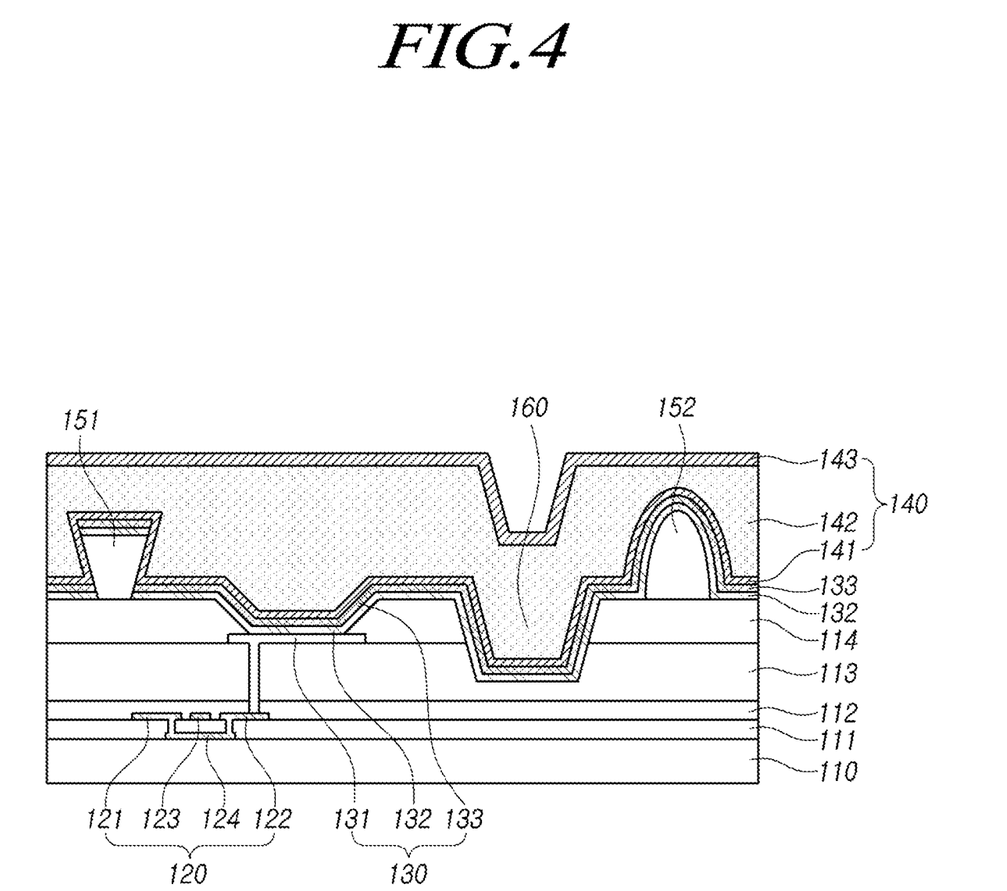
FIG. 4 is a schematic view illustrating a flexible display device including a well structure according to one or more embodiments of the present disclosure.

FIG. 4 is a schematic view illustrating a flexible display device including a well structure according to another embodiment of the present disclosure.

Referring to FIG. 4, a bank layer 114 may be disposed including a well structure 160. Due to the well structure 160 disposed in the bank layer 114, the first to the third encapsulation layers 141 to 143 of an encapsulation layer 140 have groove shapes. The well structure 160 may become a buffer space that can effectively cope with tensile and compressive stress applied to the encapsulation layer 140. In other words, the well structure 160 allows at least some portion of the encapsulation layer 140 extending into at least some portion of other layer or other layers under the encapsulation layer 140, creating an uneven portion (or rough portion) in the encapsulation layer 140 which can provide more tolerance against the stress than a flat portion alone.

In some embodiments, the well structure 160 may be at least partially defined by the bank layer 114, for example, at least a portion of the well structure 160 may include a cavity or well shape which extends into or through the bank layer 114. In some embodiments, the well structure 160 extends at least partially into the underlying bank layer 114. In some embodiments, the well structure 160 extends through the bank layer 114 to at least a level of a surface (e.g., an upper surface) of the planarization layer 113. In some embodiments, the well structure 160 extends through the bank layer 114 and at least partially into the planarization layer 113 (e.g., as shown in FIG. 4).

Since the encapsulation layer 140 has a groove shape due to the aforementioned well structure 160, a total internal reflection pattern can be generated, and an optical out-coupling effect can be produced on light emitted from an organic light-emitting element 130. Thus, improvement of the optical efficiency of the flexible display device 100 can be provided.

Meanwhile, since the encapsulation layer 140 has a groove shape due to the well structure 160, an effect of preventing the light emitted from the organic light-emitting element 130 from interfering with light emitted from other pixels can be produced. For this reason, an effect that can reduce or minimize a color mixture is obtained.

Figure 6:
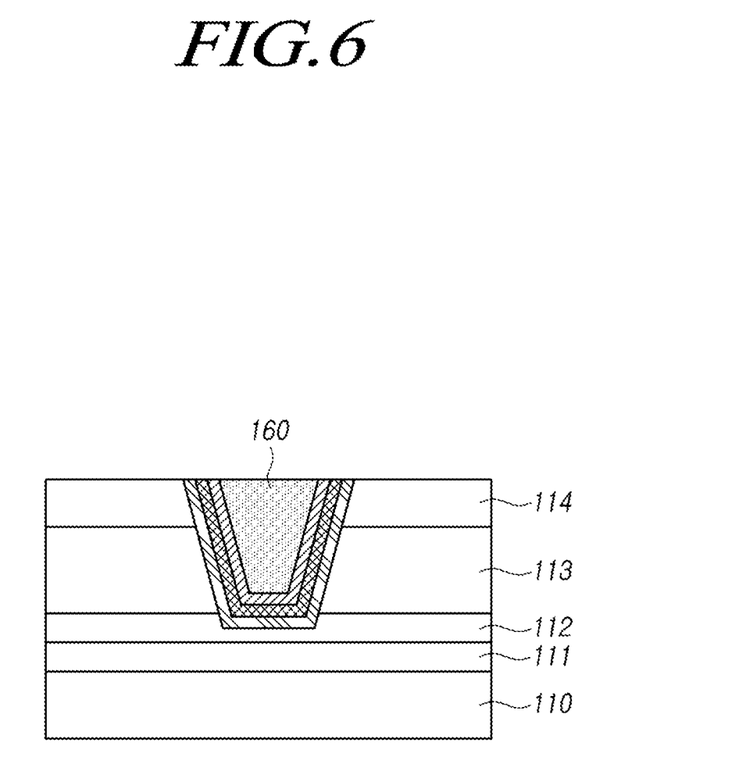
FIG. 6 a schematic view illustrating the flexible display device including the dams and the well structure.

The well structure 160 may be disposed around a pixel, and may be disposed to extend at least partially into a planarization layer 113, and in some embodiments, the well structure 160 may extend to or at least partially into a passivation layer 112 in order to increase a depth thereof, as illustrated in FIG. 6.

Due to the groove shape caused by the well structure 160, an upper surface of the encapsulation layer may have a groove shape (or a trench pattern).

Figure 5:
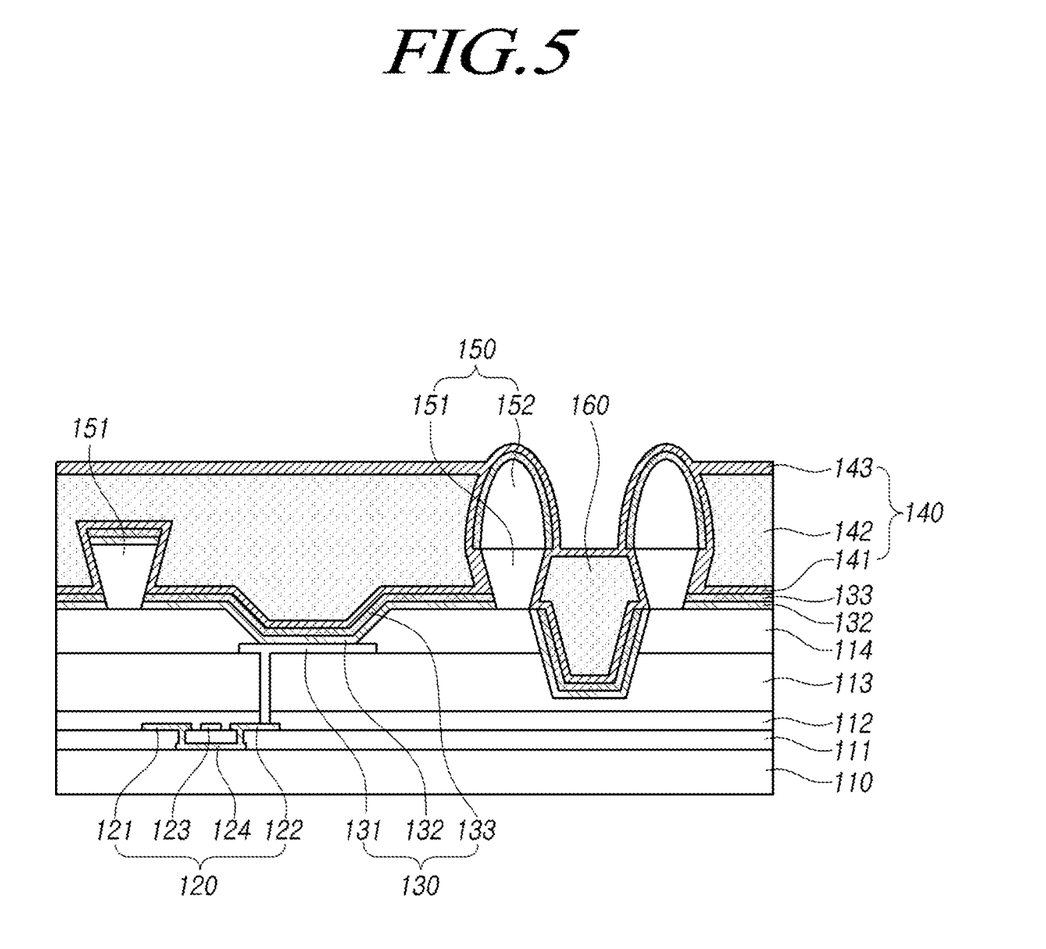
FIG. 5 is a schematic view illustrating a flexible display device including dams and a well structure according to one or more embodiments of the present disclosure.

FIG. 5 is a schematic view illustrating a flexible display device including dams and a well structure according to one or more embodiments of the present disclosure.

Referring to FIG. 5, a well structure 160 further includes at least two dams 150. The well structure 160 including at least two dams 150 provides a discontinuous section or gap in which the second encapsulation layer 142 is discontinuous or disconnected. The dams 150 are disposed such that heights of the dams 150 are higher than the sum of heights (or thicknesses) of the first encapsulation layer, the second encapsulation layer, and the third encapsulation layer 141, 142, and 143, and thereby the second encapsulation layer 142 has the discontinuous section due to the two dams 150. While FIG. 5 illustrates only a portion of the third encapsulation layer 143 disposed between the dams 150, i.e., with no portion of the second encapsulation layer 142 disposed in the discontinuous section, in some embodiments, some separate portion of the second encapsulation layer 142 may be located between the two dams 150.

The second encapsulation layer 142 that is discontinuous due to the dams 150 is configured to flexibly cope with tensile and compressive stress to reduce or minimize occurrence of cracks or the like that can occur in a flexible display device.

When the tensile stress and the compressive stress occur repetitively, the second encapsulation layer 142 can have a structure that is subjected to compression and tension by the aforementioned stress on the basis of the second encapsulation layer 142 trapped by the well structure 160.

A part of the second encapsulation layer 142 in which the well structure 160 is disposed has a lower height than the other part of the second encapsulation layer 142 which is located therearound, and a buffer space of the tensile and compressive stress applied to the parts of the second encapsulation layer 142 which have heights different from each other is provided.

For example, the height of the first encapsulation layer 141 may be 1 μm, and a height of a bank layer 114 may be about 2 μm. The height of the second encapsulation layer 142 may be about 5 μm, and the height of the third encapsulation layer 143 may be about 1 μm. Here, the first encapsulation layer 141 and the third encapsulation layer 143 may be disposed on the dams 150. Therefore, in comparison with the heights of the dams 150 and the height of the second encapsulation layer 142, a height about 1.5 μm of an inverted tapered structure 151 and a height about 2.3 μm of a spacer 152 plus the height about 2 μm of the bank layer 114 makes about 5.8 μm, and thus the heights of the dams 150 may be higher than the height about 5 μm of the second encapsulation layer 142. As a result, the dams 150 can be disposed to be higher than the encapsulation layer 140.

When each of the dams 150 having the heights as described above is configured using the components such as the inverted tapered structure 151 and the spacer 152 disposed on the bank layer 114, the dams 150 having a higher height than the aforementioned encapsulation layer 140 can be disposed.

The well structure 160 together with the two dams 150 can create an uneven portion (or rough portion) in the encapsulation layer 140 which can provide more tolerance against the stress than a flat portion alone. In some embodiments, one or more portions of the first encapsulation layer 141 and the third encapsulation layer 143 on the well structure 160 may be adjoining or even in contact with each another. For example, as shown in FIG. 5, portions of the first encapsulation layer 141 and the third encapsulation layer 143 may be adjoining or in contact with one another along one or more surfaces (e.g., outer surfaces) of the dams 150 of the well structure 160.

The foregoing descriptions and the accompanying drawings have been presented in order to explain certain principles of the present disclosure by way of example. A person having ordinary skill in the art to which the present disclosure relates could make various modifications and variations without departing from the principle of the present disclosure. The foregoing embodiments disclosed herein shall be interpreted as being illustrative, while not being limitative, of the principle and scope of the present disclosure.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A flexible display device, comprising:
   a bank layer and an organic light-emitting element disposed on a flexible substrate; and
   an encapsulation layer including a first encapsulation layer, a second encapsulation layer, and a third encapsulation layer that cover the organic light-emitting element,
   wherein the bank layer at least partially defines at least one well structure, and
   wherein the second encapsulation layer includes a first portion and a second portion that are separated from each other resulting in the second encapsulation layer not being continuous and having the first portion and the second portions spaced apart from each other;
   wherein at least two dams are disposed to disconnect the first portion from the second portion, and a third portion of the second encapsulation layer in the well structure has a lower height than the first portion.

2. The flexible display device according to claim 1, wherein the third portion is separated from the first portion and the second portions of the second encapsulation layer.

3. A flexible display device, comprising:
a plurality of organic light-emitting element disposed on a flexible substrate;
a bank layer on the flexible substrate; and
an encapsulation layer including a first encapsulation layer, a second encapsulation layer, and a third encapsulation layer that cover the organic light-emitting element,
wherein the bank layer at least partially defines at least one well structure that is located between two light-emitting elements of the plurality of light emitting elements, and
wherein the second encapsulation layer includes a first portion and a second portion that are separated from each other resulting in the second encapsulation layer not being continuous and having the first portion and the second portion spaced apart from each other;
wherein portions of the first and the third encapsulation layers on the well structure are adjoined to each other.

4. The flexible display device according to claim 1, further comprising a planarization layer on the flexible substrate,
wherein the well structure extends at least partially into the planarization layer.

5. The flexible display device according to claim 4, wherein the planarization layer is discontinuous at a location corresponding to the well structure.

6. The flexible display device according to claim 1, further comprising a passivation layer on the flexible substrate,
wherein the well structure extends at least partially into the passivation layer.

7. A flexible display device, comprising:
a bank layer and an organic light-emitting element disposed on a flexible substrate; and
an encapsulation layer including a first encapsulation layer, a second encapsulation layer, and a third encapsulation layer that cover the organic light-emitting element,
wherein the bank layer at least partially defines at least one well structure, and
wherein the second encapsulation layer includes a first portion and a second portion that are separated from each other resulting in the second encapsulation layer not being continuous and having the first portion and the second portion spaced apart from each other;
wherein the well structure includes at least two dams spaced apart from each other, and a first dam and a second dam of the at least two dams are located adjacent to the first portion and the second portion, respectively, such that a part of the well structure is located between the first dam and the second dam in a cross-sectional view.

8. The flexible display device according to claim 7, wherein heights of the dams are higher than or equal to the sum of heights of the first encapsulation layer, the second encapsulation layer, and the third encapsulation layer.

9. The flexible display device according to claim 7, wherein each of the at least two dams includes an inverted tapered structure and a spacer on the bank layer.

10. The flexible display device according to claim 1, wherein an upper surface of the encapsulation layer has a groove shape due to the well structure.

* * * * *

UNITED STATES PATENT AND TRADEMARK OFFICE
CERTIFICATE OF CORRECTION

PATENT NO. : 11,456,430 B2
APPLICATION NO. : 16/678877
DATED : September 27, 2022
INVENTOR(S) : Miseong Kim Page 1 of 1

It is certified that error appears in the above-identified patent and that said Letters Patent is hereby corrected as shown below:

In the Claims

Column 9, Claim 2, Line 3:
"the second portions"
Should read:
--the second portion--.

Signed and Sealed this
Twenty-third Day of July, 2024

Katherine Kelly Vidal
*Director of the United States Patent and Trademark Office*